(12) United States Patent
Hopkins et al.

(10) Patent No.: US 12,432,924 B2
(45) Date of Patent: Sep. 30, 2025

(54) INTEGRATED CIRCUITRY AND METHOD USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 18/218,496

(22) Filed: Jul. 5, 2023

(65) Prior Publication Data

US 2023/0363163 A1 Nov. 9, 2023

Related U.S. Application Data

(62) Division of application No. 17/030,751, filed on Sep. 24, 2020, now Pat. No. 11,744,069.

(Continued)

(51) Int. Cl.
*H01L 21/31* (2006.01)
*H10B 43/27* (2023.01)
(Continued)

(52) U.S. Cl.
CPC ........ *H10B 43/27* (2023.02); *H01L 21/31116* (2013.01); *H10B 43/10* (2023.02)

(58) Field of Classification Search
CPC .... H10B 43/27; H10B 43/10; H01L 21/31116
See application file for complete search history.

(56) References Cited

U.S. PATENT DOCUMENTS 6,844,227 B2  1/2005  Kubo et al.
10,236,301 B1  3/2019  Howder et al.
(Continued)

FOREIGN PATENT DOCUMENTS

KR  10-2015-0126524  11/2015

OTHER PUBLICATIONS

WO PCT/US2021/044627 IPRP, Feb. 28, 2023, Micron Technology, Inc.
(Continued)

*Primary Examiner* — Kyoung Lee
(74) *Attorney, Agent, or Firm* — Wells St. John P.S.

(57) ABSTRACT

Integrated circuitry comprising a memory array comprises strings of memory cells comprising laterally-spaced memory blocks that individually comprise a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises alternating first insulating tiers and second insulating tiers. The lower portion comprises a lowest insulator tier directly above conductor material of a conductor tier. The lowest insulator tier comprises solid carbon and nitrogen-containing material. An immediately-adjacent tier is directly above the solid carbon and nitrogen-containing material of the lowest insulator tier. The immediately-adjacent tier comprises material that is of different composition from that of the lowest insulator tier. Other embodiments, including methods, are disclosed.

8 Claims, 12 Drawing Sheets

Related U.S. Application Data

(60) Provisional application No. 63/070,979, filed on Aug. 27, 2020.

(51) Int. Cl.
*H01L 21/311* (2006.01)
*H10B 43/10* (2023.01)

(56) References Cited

U.S. PATENT DOCUMENTS

| | | |
|---|---|---|
| 10,720,445 B1 | 7/2020 | Shimizu et al. |
| 2005/0255642 A1 | 11/2005 | Liu et al. |
| 2010/0248485 A1 | 9/2010 | Block et al. |
| 2015/0179936 A1 | 6/2015 | Schubert et al. |
| 2015/0318301 A1 | 11/2015 | Lee et al. |
| 2016/0315095 A1 | 10/2016 | Sel et al. |
| 2017/0301685 A1 | 10/2017 | Dorhout et al. |
| 2018/0261671 A1 | 9/2018 | Matsumoto et al. |
| 2018/0269221 A1 | 9/2018 | Oda et al. |
| 2018/0323213 A1* | 11/2018 | Arai ................ H10B 41/35 |
| 2019/0067306 A1 | 2/2019 | Fang et al. |
| 2019/0157294 A1 | 5/2019 | Kanamori et al. |
| 2020/0111796 A1 | 4/2020 | Nourbakhsh et al. |
| 2021/0135108 A1 | 5/2021 | Park et al. |

OTHER PUBLICATIONS

WO PCT/US2021/044627 Search Rep., Nov. 26, 2021, Micron Technology, Inc.
WO PCT/US2021/044627 Writt. Opin., Nov. 26, 2021, Micron Technology, Inc.

\* cited by examiner

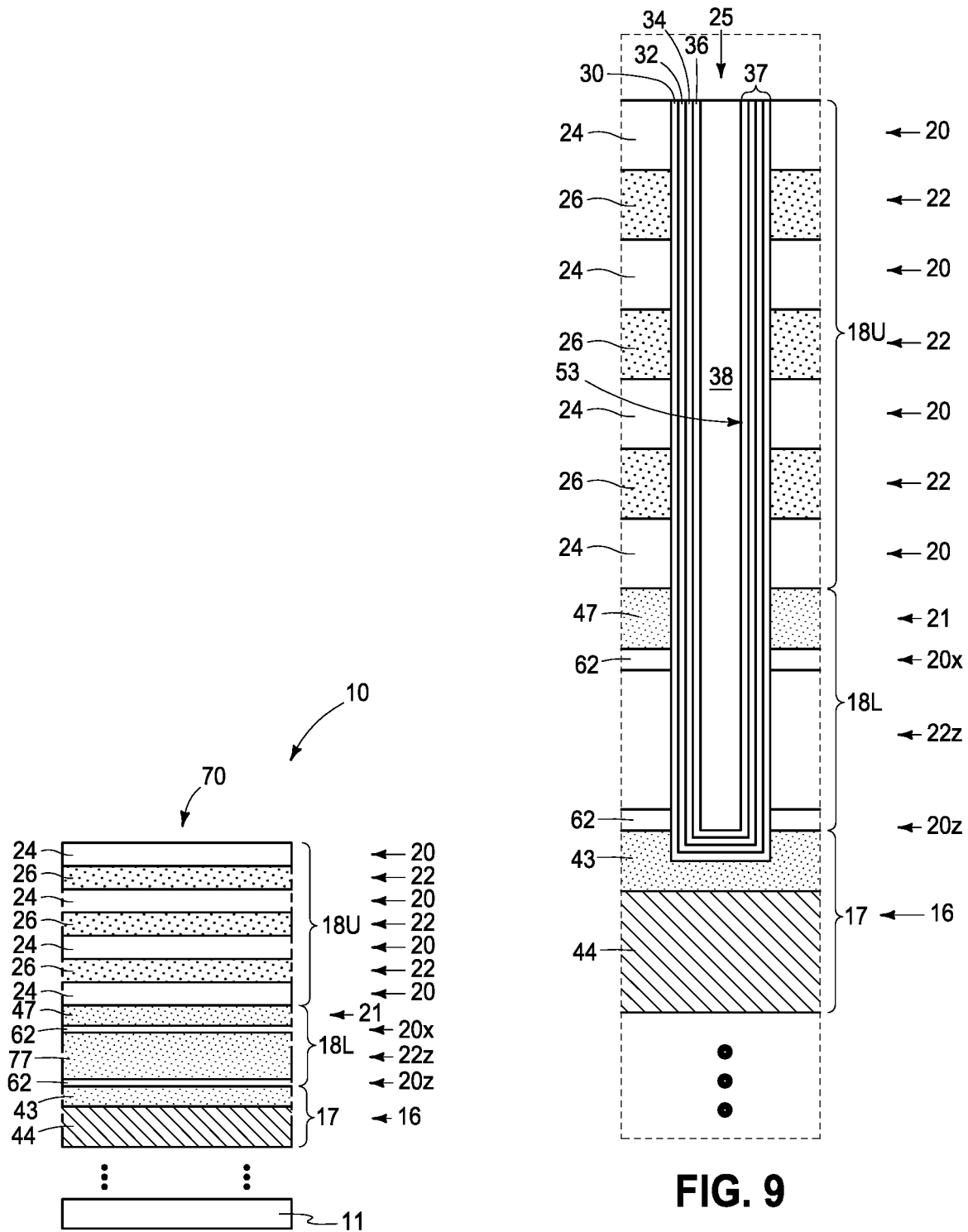

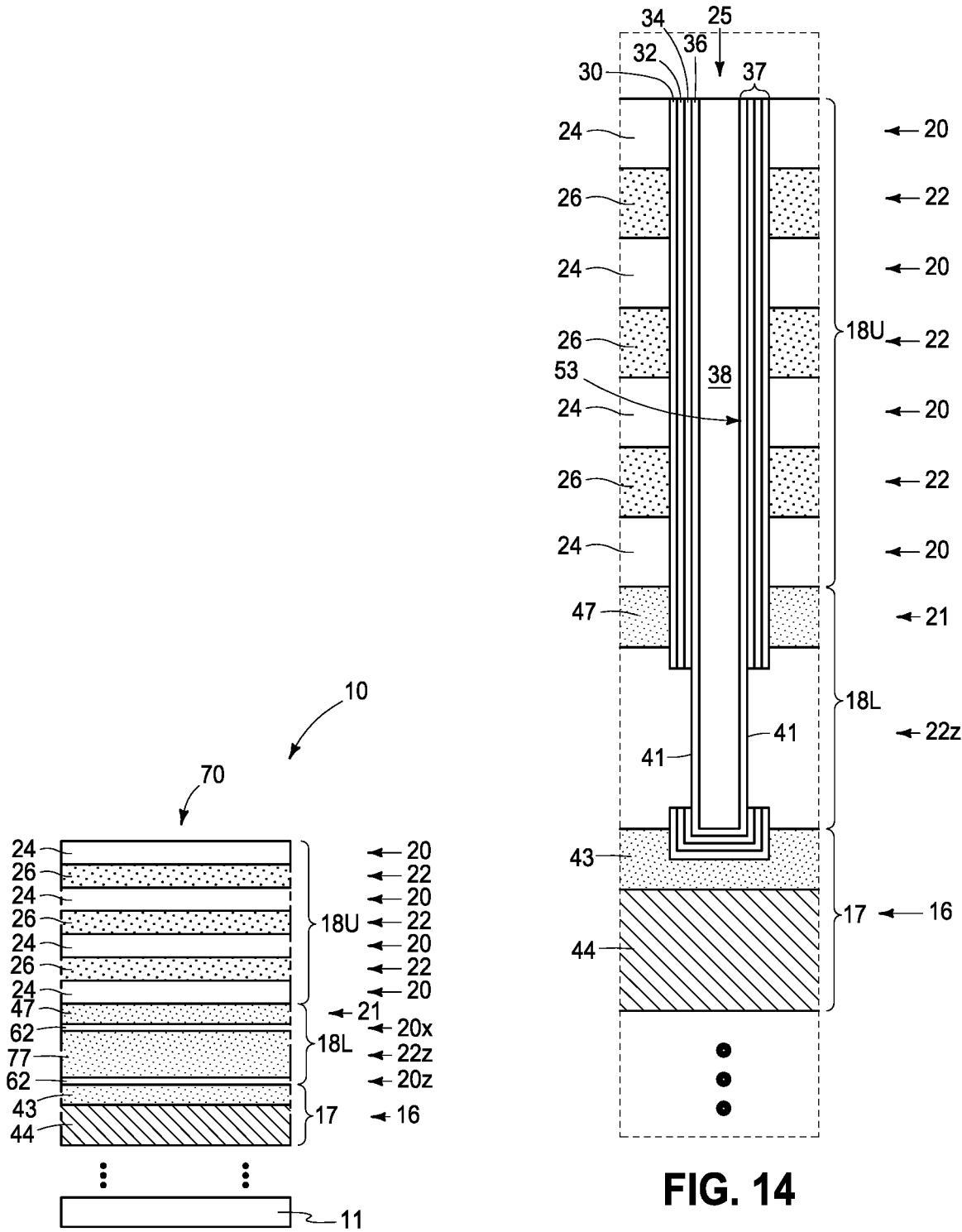

INTEGRATED CIRCUITRY AND METHOD USED IN FORMING A MEMORY ARRAY COMPRISING STRINGS OF MEMORY CELLS

RELATED PATENT DATA

This patent resulted from a divisional application of Ser. No. 17/030,751, filed U.S. Patent Application Sep. 24, 2020, entitled "Integrated Circuitry And Method Used In Forming A Memory Array Comprising Strings Of Memory Cells", naming John D. Hopkins and Alyssa N. Scarbrough as inventors, which claims priority to U.S. Provisional Patent Application Ser. No. 63/070,979, filed Aug. 27, 2020, entitled "Integrated Circuitry And Method Used In Forming A Memory Array Comprising Strings Of Memory Cells", naming John D. Hopkins and Alyssa N. Scarbrough as inventors, the disclosures of which are incorporated by reference.

TECHNICAL FIELD

Embodiments disclosed herein pertain to integrated circuitry and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 3-23 are diagrammatic sequential sectional, expanded, enlarged, and/or partial views of the construction of FIGS. 1 and 2, or portions thereof, in process in accordance with some embodiments of the invention.

DETAILED DESCRIPTION OF EXAMPLE EMBODIMENTS

Embodiments of the invention encompass methods used in forming a memory array comprising strings of memory cells, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass existing or future-developed integrated circuitry comprising a memory array comprising strings of memory cells independent of method of manufacture, for example comprising NAND architecture. First example method embodiments are described with reference to FIGS. 1-23 which may be considered as a "gate-last" or "replacement-gate", and starting with FIGS. 1 and 2.

Figure 1:
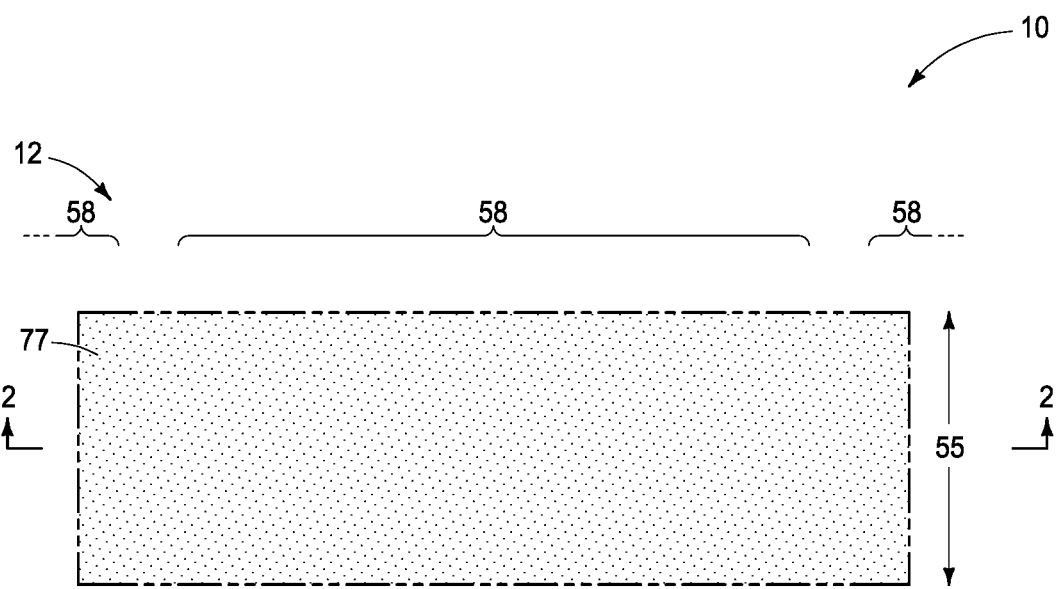
FIG. 1 is a diagrammatic cross-sectional view of a portion of a substrate in process in accordance with an embodiment of the invention and is taken through line 1-1 in FIG. 2.
Figure 2:
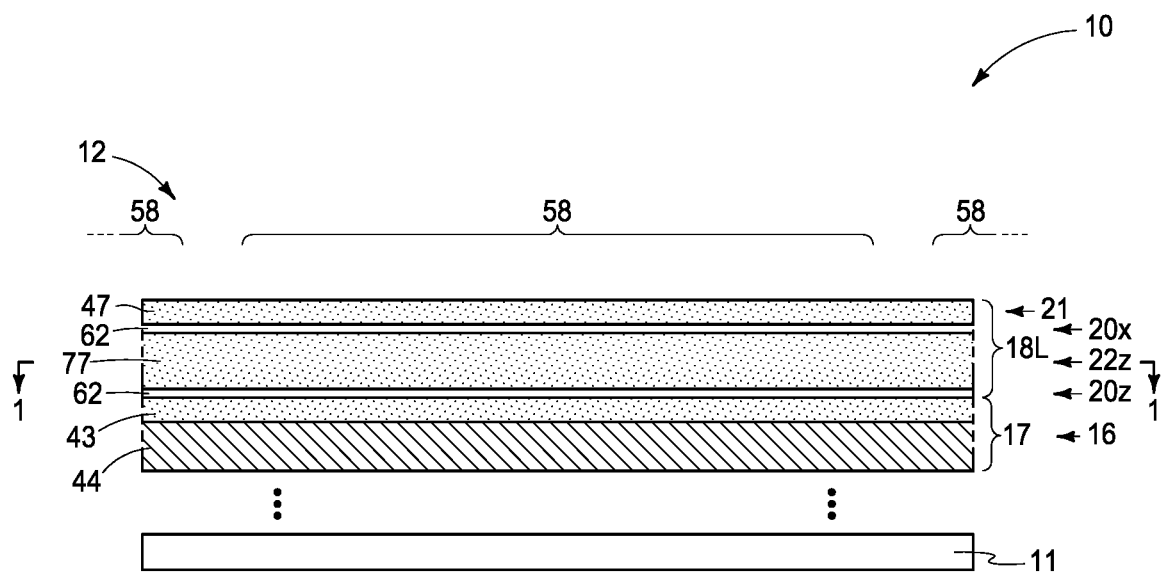
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In some embodiments and as shown, a conductor tier 16 comprising conductor material 17 has been formed above substrate 11. As an example, conductor material 17 comprises upper conductor material 43 (e.g., n-type or p-type conductively-doped polysilicon) directly above (e.g., directly against) lower conductor material 44 (e.g., WSi$_x$) of different composition from upper conductor material 43. Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest 20z of second tiers 20* directly above (e.g., directly against) conductor material 17. Lowest second tier 20z is sacrificial and comprises solid carbon and nitrogen-containing material 62. In one embodiment, solid carbon and nitrogen-containing material 62 comprises at least one of carbon-doped silicon nitride and C$_3$N$_4$. If carbon-doped silicon nitride, in one embodiment, carbon content thereof is 1 to 30 atomic percent, in one such embodiment from 5 to 25 atomic percent, and in one such embodiment from 10 to 15 atomic percent.

A lowest tier 22z of first tiers 22* is directly above (e.g., directly against) lowest second tier 20z and comprises sacrificial material 77 that is of different composition from that of lowest second tier 20z. Example sacrificial materials 77 include silicon nitride and doped or undoped polysilicon. In this document, "undoped polysilicon" is polysilicon having from 0 atoms/cm$^3$ to $1\times10^{12}$ atoms/cm$^3$ of atoms of conductivity-increasing impurity. "Doped polysilicon" is polysilicon that has more than $1\times10^{12}$ atoms/cm$^3$ of atoms of conductivity-increasing impurity and "conductively-doped polysilicon" is polysilicon that has at least $1\times10^{18}$ atoms/cm$^3$ of atoms of conductivity-increasing impurity. In one embodiment, a next-lowest 20x of second tiers 20* is directly above lowest first tier 22z and in one embodiment comprises solid carbon and nitrogen-containing material 62. In one embodiment, a conducting-material tier 21 comprising conducting material 47 (e.g., conductively-doped polysilicon) is directly above next-lowest second tier 20x.

Referring to FIGS. 3-7, vertically-alternating first tiers 22 and second tiers 20 of an upper portion 18U of stack 18* have been formed above lower portion 18L. First tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20 and first tiers 22 in upper portion 18U to conductor tier 16 (e.g., at least to lowest first tier 22z). Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25.

Horizontally-elongated trenches 40 have been formed (e.g., by anisotropic etching) into stack 18* and that are individually between immediately-laterally-adjacent memory-block regions 58. By way of example and for brevity only, channel openings 25 are shown as being arranged in groups or columns of staggered rows of four and five channel openings 25 per row. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other.

Trenches 40 as shown have been formed to extend to sacrificial material 77 in lowest first tier 22z. As one example, trenches 40 may initially be formed by etching materials 24, 26, and 47 (likely using different anisotropic etching chemistries) and that stops on or within material 62 of next-lowest second tier 20x (when present). A thin sacrificial liner 78 (e.g., hafnium oxide, aluminum oxide, etc.) may then be formed, followed by punch-etching therethrough to expose material 62, and followed by punch-etching through material 62 to expose sacrificial material 77. Alternately, and by way of example only, a sacrificial etch-stop line (not shown) having the same general horizontal outline as trenches 40 may individually be formed in conducting-material tier 21 (when present) directly above and in contact with material 62 of next-lowest second tier 20x before forming upper portion 18U. Trenches 40 may then be formed by etching materials 24 and 26 to stop on or within the material of the individual sacrificial lines, followed by exhuming remaining material of such lines prior to forming thin sacrificial liner 78.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 3-6 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U and used analogous to the sacrificial etch-stop lines described above in forming channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space (s) (not shown) and/or be devoid of solid material (not shown).

Figure 3:
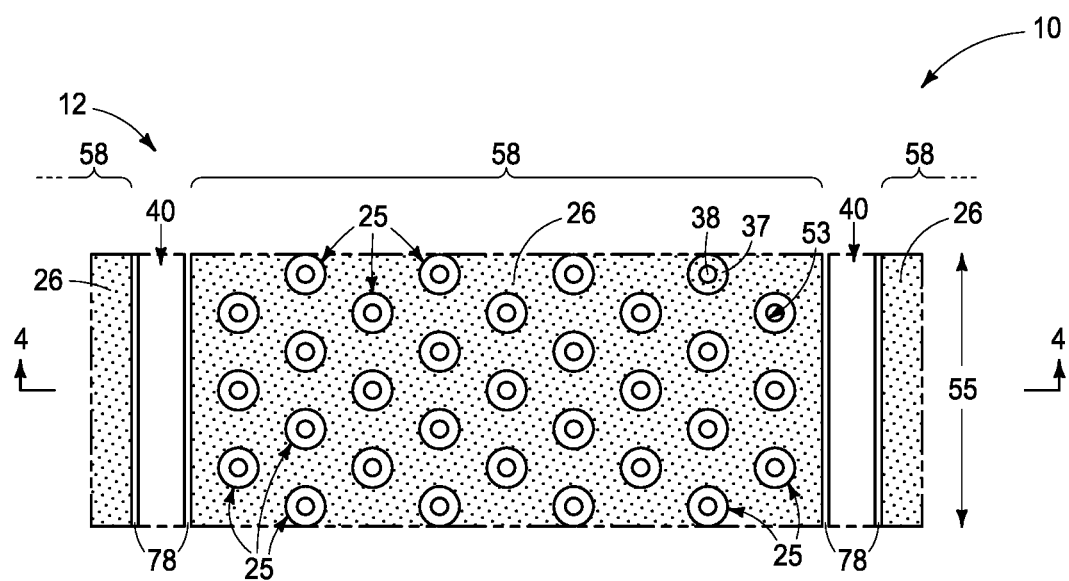
Figure 4:
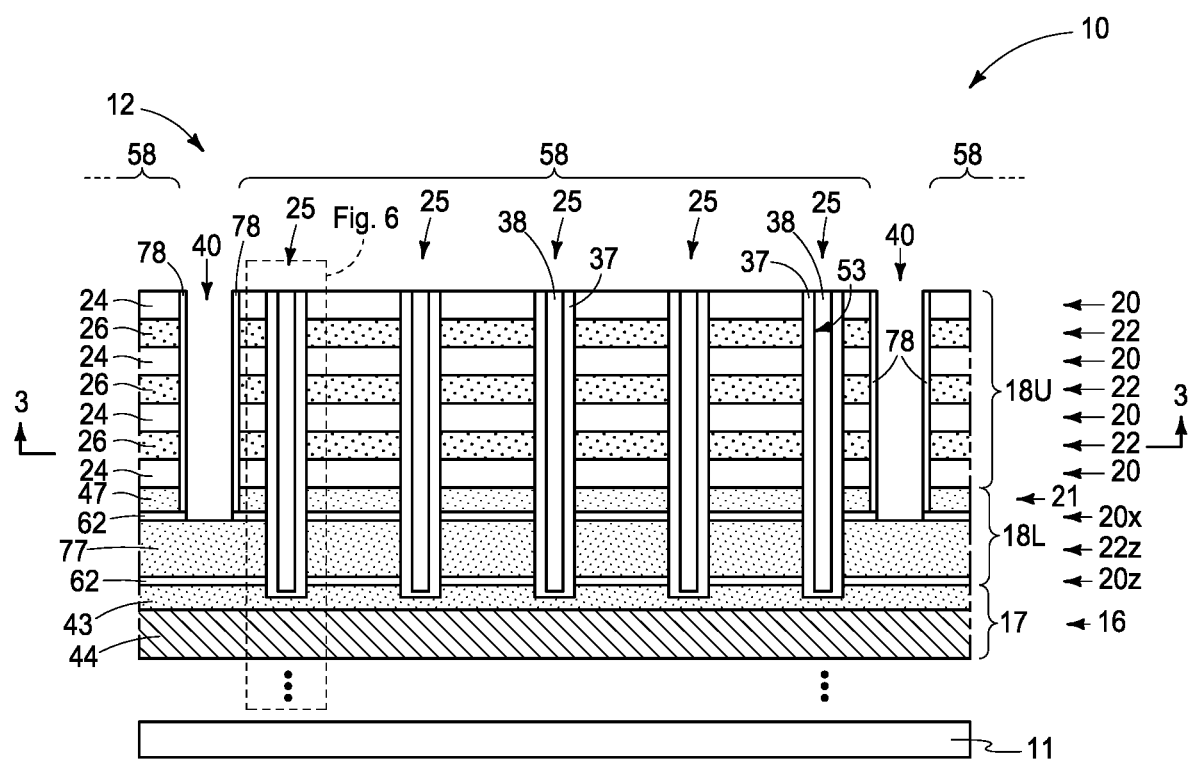
Figure 5:
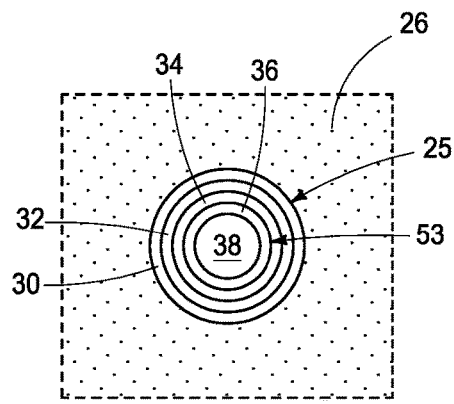
Figure 7:
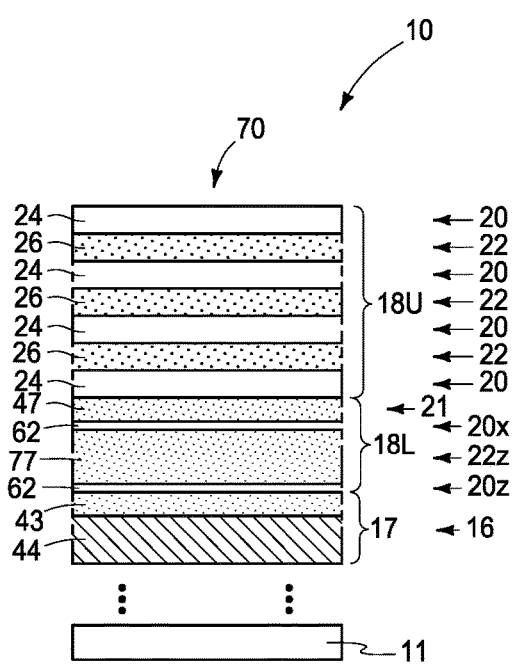
Figure 6:
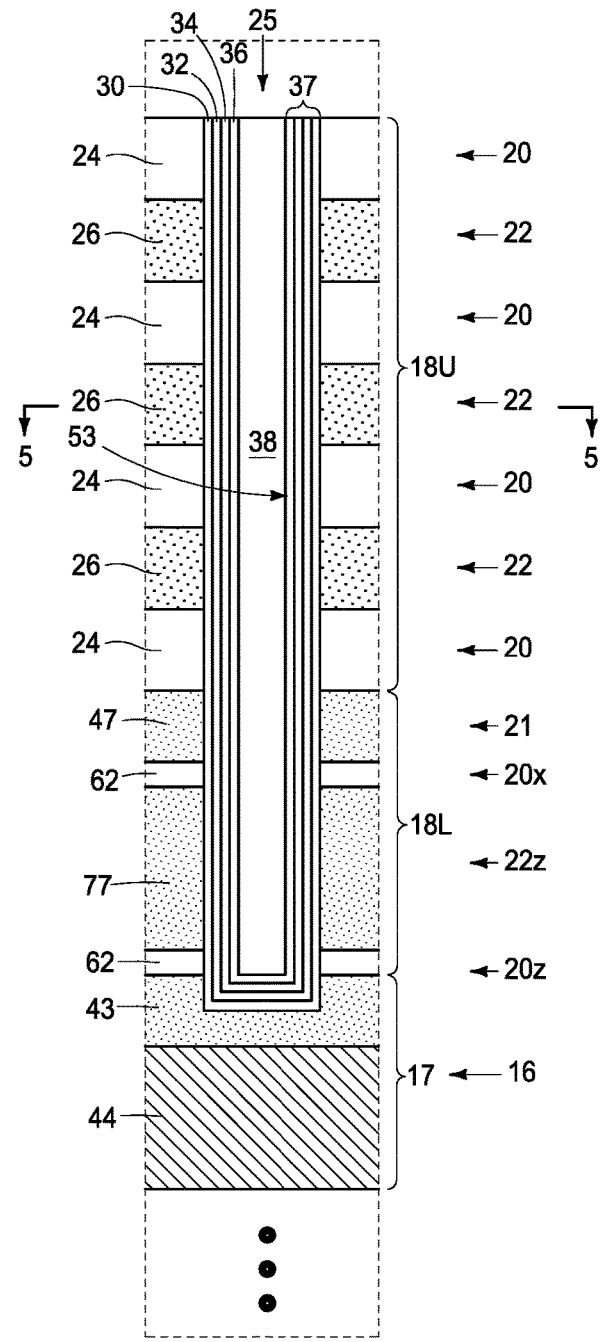

In some embodiments, construction 10 may be considered as comprising a first region (e.g., as shown by FIGS. 3 and 4) and a second region 70 aside the first region (e.g., as shown in FIG. 7). Second region 70 may be laterally-contacting the first region (not shown) or may be laterally-spaced from the first region (e.g., closely laterally there-adjacent but not touching, or laterally-far there-from and not touching). Second region 70 may be within one or more of the memory block regions (not shown). In some embodiments, construction 10 may be considered as comprising a first vertical stack (e.g., stack 18* in FIG. 4) and a second vertical stack (e.g., stack 18* in second region 70), with the second stack comprising an upper portion 18U and a lower portion 18L.

Figure 8:
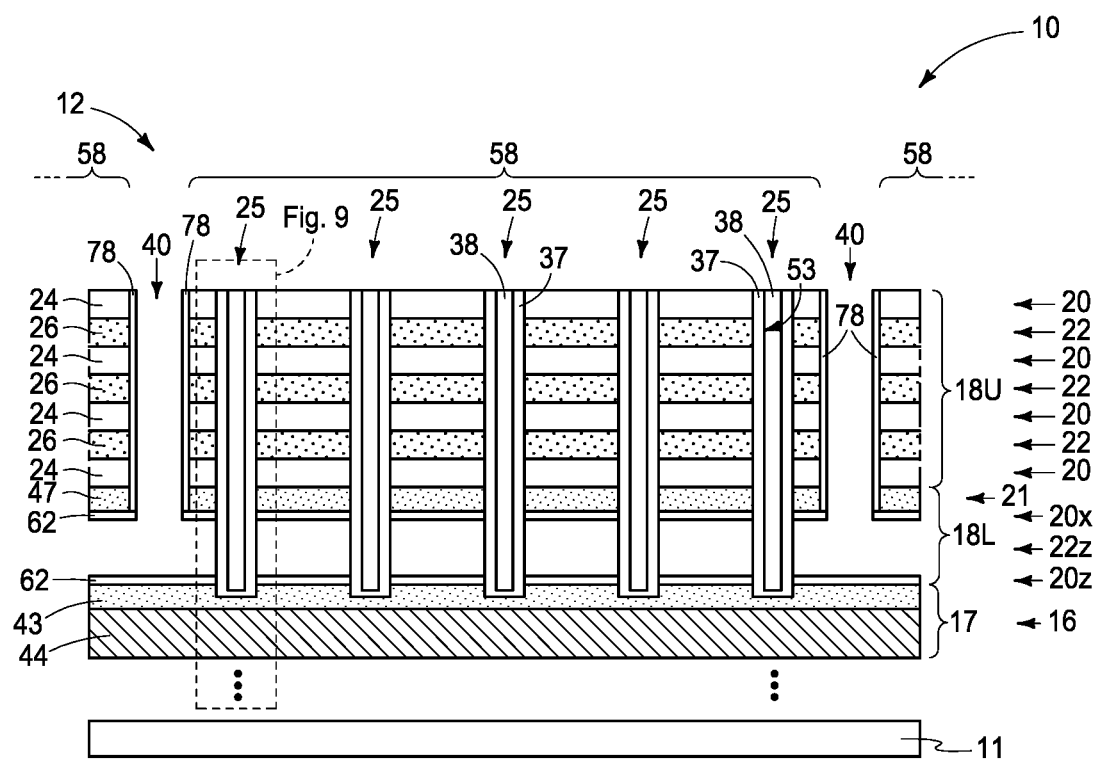

Referring to FIGS. 8-10, sacrificial material 77 (not shown) has been isotropically etched from lowest first tier 22z through trenches 40 (e.g., using liquid or vapor $H_3PO_4$ as a primary etchant where material 77 is silicon nitride and exposed other materials comprise one or more oxides or polysilicon or using tetramethyl ammonium hydroxide [TMAH] where material 77 is polysilicon). In one embodiment and as shown, the isotropically etching is conducted selectively relative to carbon and nitrogen-containing material 62 and at a selectivity of at least 5:1 relative thereto (as will occur with the above example materials and etchants). In one embodiment and as shown, the isotropic etching has occurred in the first region (e.g., FIG. 8) and has not occurred in second region 70 (FIG. 10), for example if trenches 40 are not formed in second region 70 or sacrificial material 77 is otherwise not etched in second region 70.

Figures 11, 12:
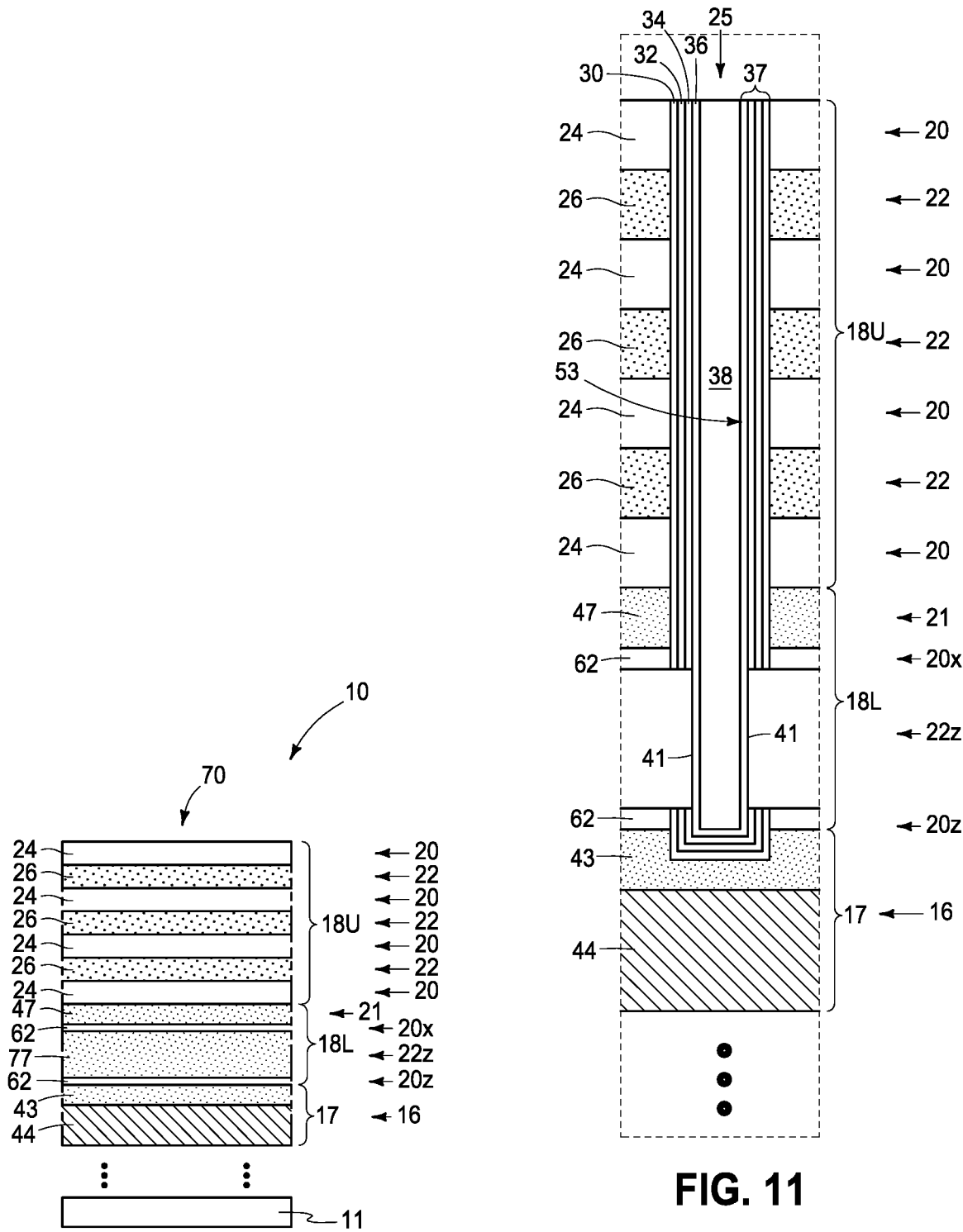

Conductive material is formed in the lowest first tier that directly electrically couples together the channel material of the individual channel-material strings and the conductor material of the conductor tier. In one embodiment, such conductive material is formed directly against a bottom of the conducting material of the conducting tier and directly against a top of the conductor material of the conductor tier. For example, and first referring to FIGS. 11 and 12, such show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 78 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 11 and 12. The artisan is capable of selecting other chemistries for etching other different materials where a construction as shown in FIGS. 11 and 12 is desired. In one embodiment and as shown, the removing of materials 30, 32, and 34 in tier 22z has occurred in the first region (e.g., FIG. 11) and has not occurred in second region 70 (FIG. 12, if there-present and not shown).

Figure 13:
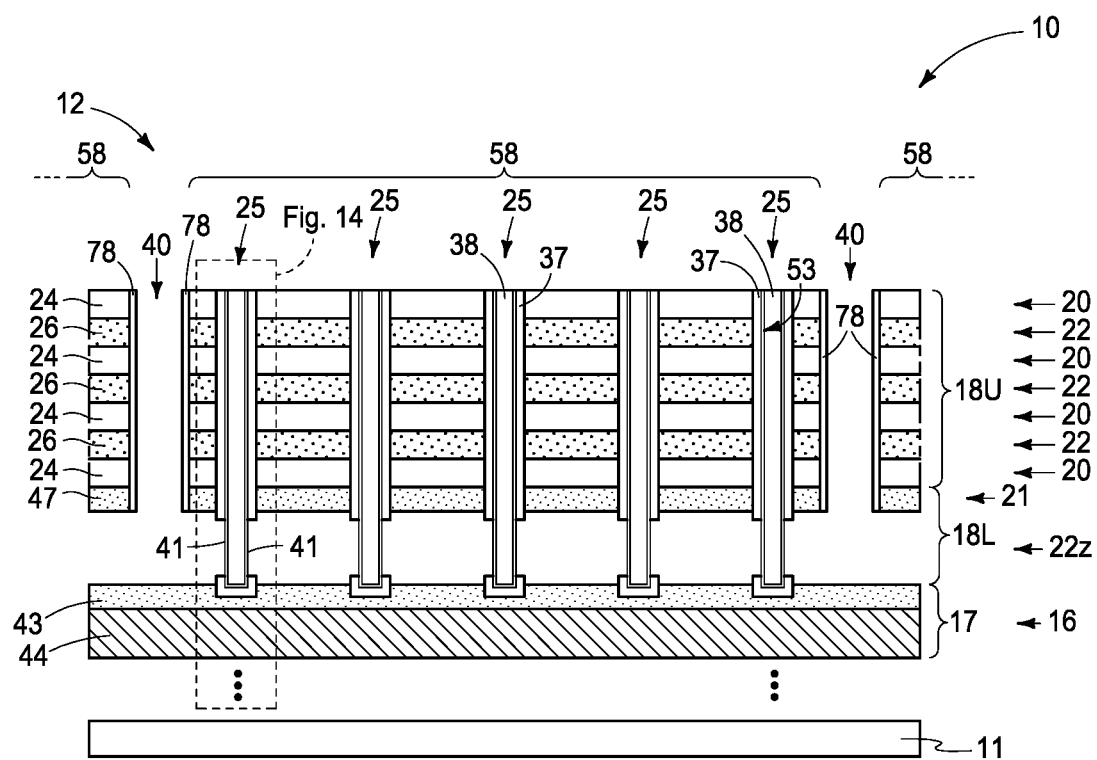

Referring to FIGS. 13-15, lowest second tier 20z has been removed, for example by isotropic etching through trenches 40. For example, and by way of example only, a solution of potassium hydroxide will etch carbon-doped silicon nitride and $C_3N_4$. In one embodiment, where next-lowest second tier 20x is present and comprises carbon and nitrogen-containing material, next-lowest second tier 20x (not shown) is also removed during the removing of lowest second tier 20z. As an additional ideal example where carbon and nitrogen-containing material 62 comprises carbon-doped silicon nitride, the isotropic etching thereof comprises removing carbon from the carbon-doped silicon nitride using a dry etching chemistry (e.g., $H_2$ or $O_2$). Thereafter, an aqueous etching chemistry (e.g., $H_3PO_4$) is used to etch the remnant silicon nitride. In one embodiment and as shown, the removing of lowest second tier 20z and next-lowest second tier 20x has occurred in the first region (e.g., FIG. 14) and has not occurred in second region 70 (FIG. 15, if there-present and not shown).

Figure 16:
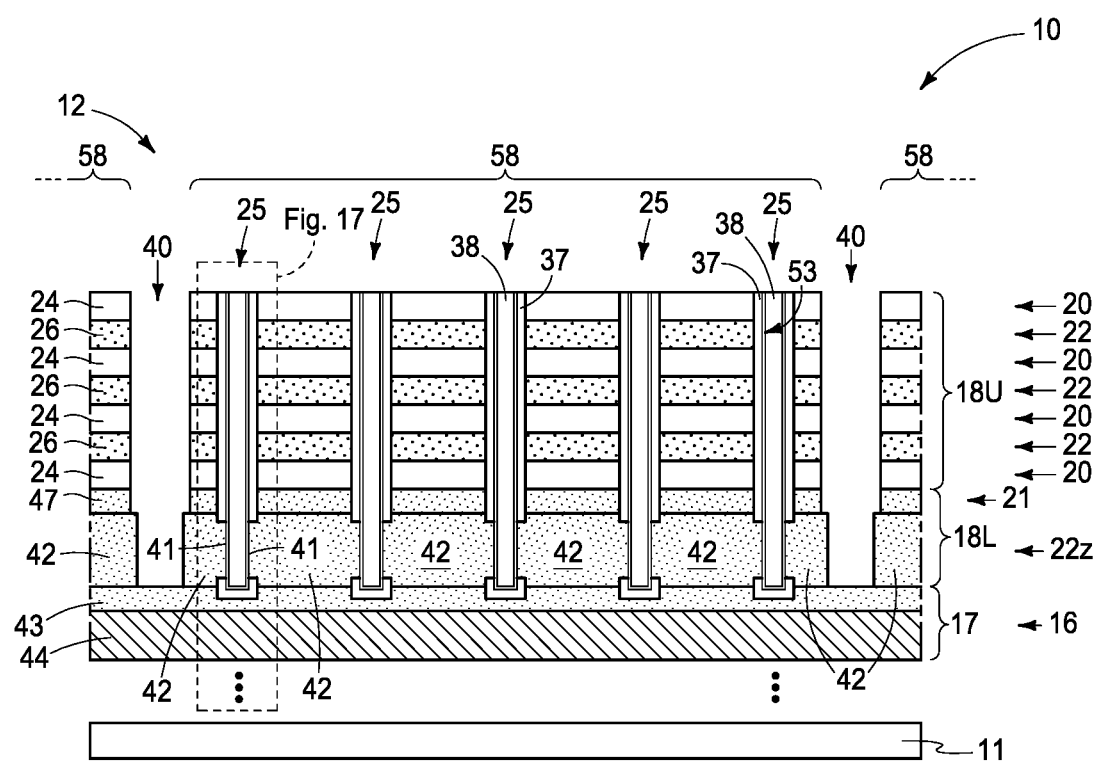
Figure 17:
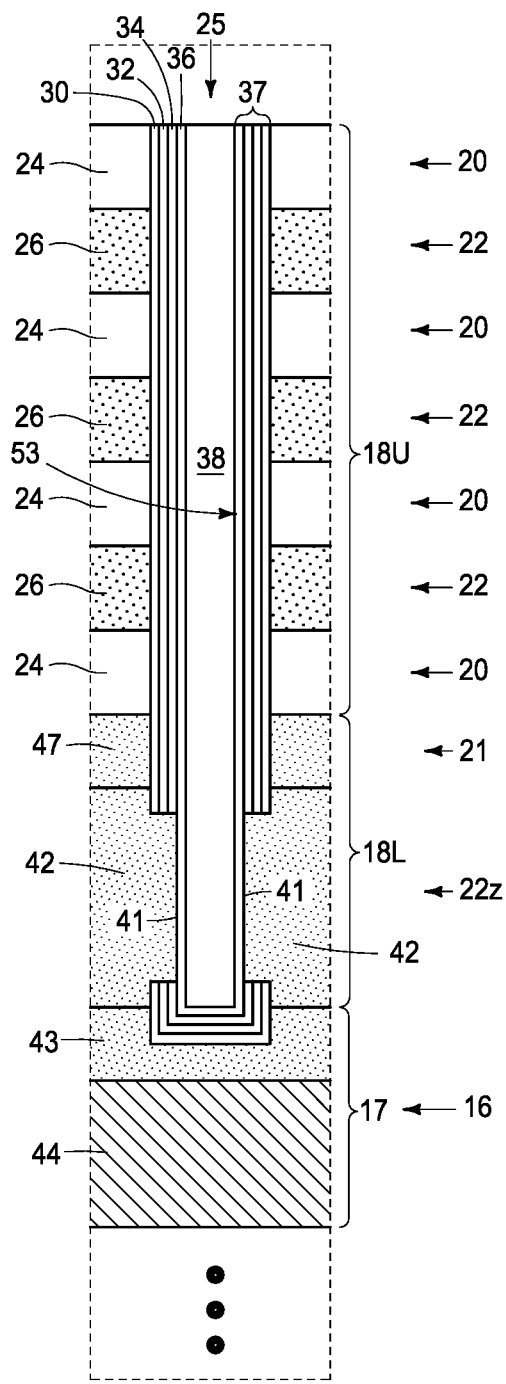
Figure 18:
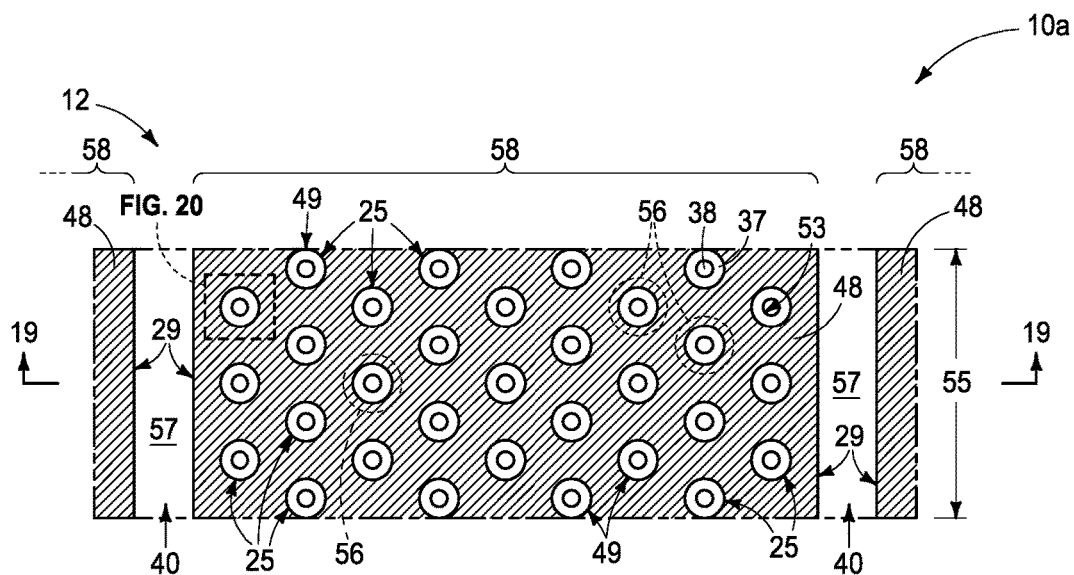
Figure 19:
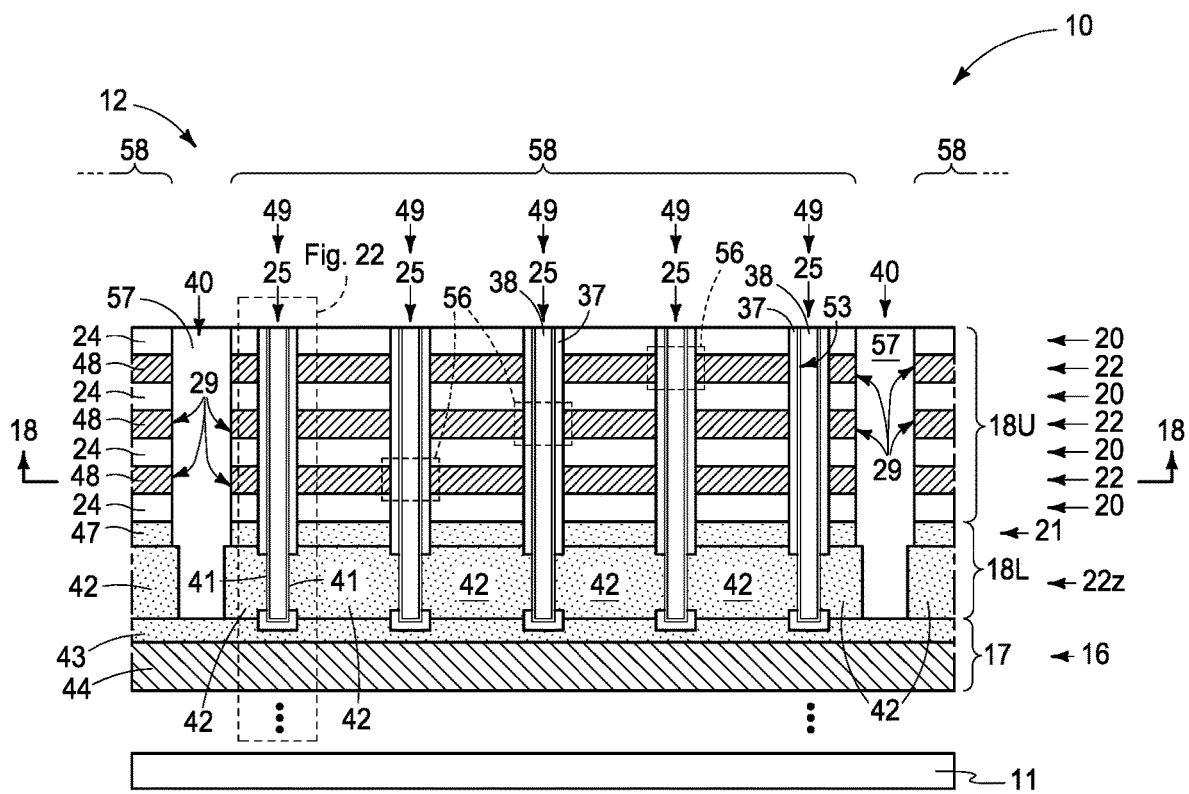
Figure 20:
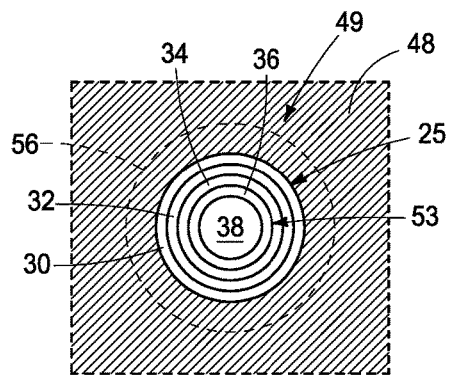
Figure 21:
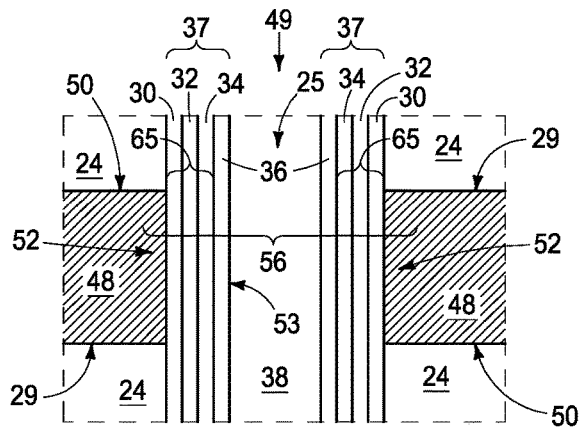

Referring to FIGS. 16 and 17, conductive material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting tier 21 and directly against a top of conductor material 43 of conductor tier 16, thereby directly electrically coupling together channel material 36 of individual channel-material strings 53 with conductor material 43 of conductor tier 16 and conducting material 47 of conducting tier 21. Subsequently, and by way of example, conductive material 42 has been removed from trenches 40 as has sacrificial liner 78 (not shown). Sacrificial liner 78 may be removed before forming conductive material 42 (not shown).

Referring to FIGS. 18-22, material 26 (not shown) of conductive tiers 22* has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 21 and some with dashed outlines in FIGS. 18-20, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 21) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, the lowest surface of channel material 36 of channel-material strings 53 is never directly against any of conductor material 17 of conductor tier 16. In one embodiment and as shown, conductive material 42 is directly against sidewalls 41 of channel-material strings 53.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Figure 23:
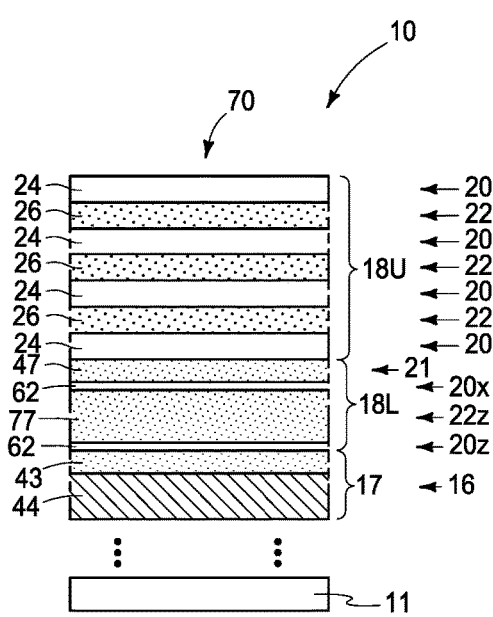
Figure 22:
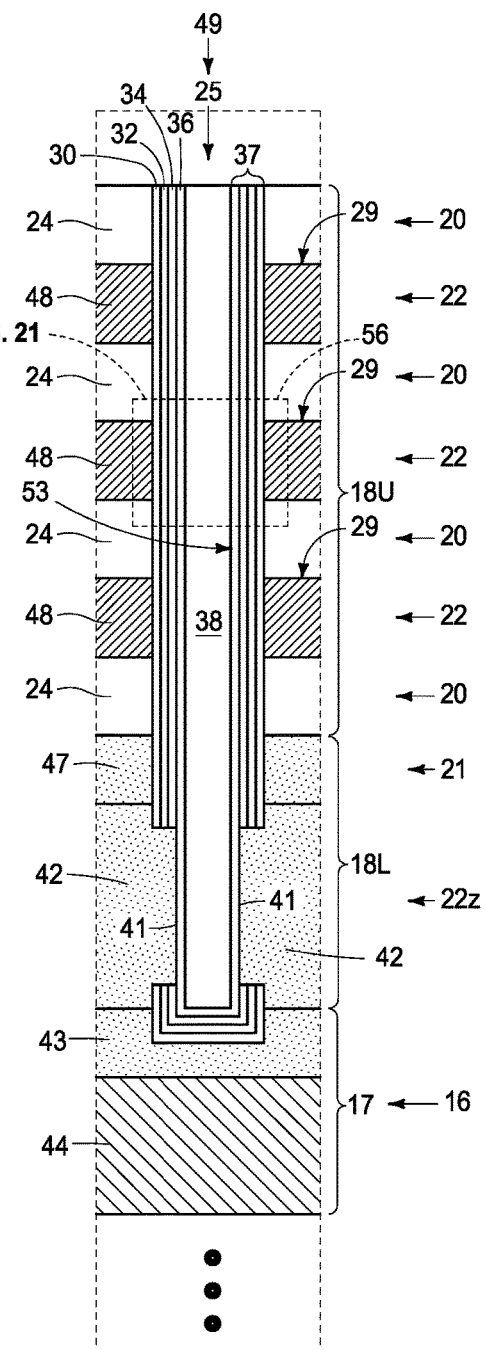

Referring to FIGS. 18-23, in one embodiment and as shown, the forming of conducting material 48 occurs in the first region (FIG. 19) and not with respect to the second vertical stack 18* in second region 70 (FIG. 23). Accordingly, in one embodiment, resultant second vertical stack 18* in second region 70 comprises an upper portion 18U comprising alternating first insulating tiers 22* and second insulating tiers 20*. A lower portion 18L of second vertical stack 18* comprises a lowest insulator tier 20z directly above conductor material 17 of conductor tier 16, with lowest insulator tier 20z comprising solid carbon and nitrogen-containing material 62. An immediately-adjacent tier 22z is directly above carbon and nitrogen-containing material 62 of lowest insulator tier 20z, with immediately-adjacent tier 22z comprising material that is of different composition from that of lowest insulator tier 20z. In one embodiment, a next-lowest insulative tier 20x is directly above immediately-adjacent tier 22z and comprises solid carbon and nitrogen-containing material 62. A conducting-material tier 21 comprising conducting material 47 is directly above immediately-adjacent tier 22z. Regardless, in one embodiment, the second vertical stack having its lowest insulator tier and its immediately-adjacent tier remain in a finished construction of the memory array.

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry comprising a memory array (e.g., 12) comprising strings (e.g., 49) of memory cells (e.g., 56) comprises laterally-spaced memory blocks (e.g., 58) individually comprising a first vertical stack (e.g., 18* in FIG. 19) comprising alternating insulative tiers (e.g., 20*) and conductive tiers (e.g., 22*). Strings (e.g., 49) of memory cells (e.g., 56) comprising channel-material strings (e.g., 53) extend through the insulative tiers and the conductive tiers. The conductive tiers individually comprise a horizontally-elongated conductive line (e.g., 29). A second vertical stack (e.g., 18* in FIG. 23) is aside the first vertical stack and comprises an upper portion (e.g., 18U) and a lower portion (e.g., 18L). The upper portion comprises alternating first insulating tiers (e.g., 22*) and second insulating tiers (e.g., 20*). The lower portion comprises a lowest insulator tier (e.g., 20z) directly above conductor material (e.g., 17) of a conductor tier (e.g., 16), with the lowest insulator tier comprising solid carbon and nitrogen-containing material (e.g., 62). An immediately-adjacent tier (e.g., 22z) is directly above the carbon and nitrogen-containing material of the lowest insulator tier, with the immediately-adjacent tier comprising material that is of different composition from that of the lowest insulator tier. In one embodiment, a next-lowest insulator tier (e.g., 20x) is directly above the immediately-adjacent tier and comprises the solid carbon and nitrogen-containing material. A conducting-material tier (e.g., 21) comprising conducting material (e.g., 47) is directly above the immediately-adjacent tier. Any other attribute(s) or aspect(s) as shown and/or described herein with respect to other embodiments may be used.

Use of carbon and nitrogen-containing material 62 in one or both of tiers 20x and 20z as opposed to, for example, silicon dioxide may provide advantages. For example, such material can be provided thinner than silicon dioxide due to its typical greater etch resistance to etch chemistries that are used to remove silicon nitride and polysilicon. Such may also enable reduction of overall stack height of lower portion 18L, including thickness of sacrificial material 77 that can reduce tendency for seams to form in conductive material 42. Further, carbon and nitrogen-containing material may protect material 43 from undesired etch better than silicon dioxide, and may remain in the processing steps longer before its removal as compared to silicon dioxide and thus provide longer as well as greater protection.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of component s may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises sacrificial material. A lowest of the second tiers is below the lowest first tier, is sacrificial, and comprises solid carbon and nitrogen-containing material that is of different composition from that of the sacrificial material. The vertically-alternating first tiers and second tiers of an upper portion of the stack are formed above the lower portion. Channel-material strings are formed that extend through the first tiers and the second tiers in the upper portion to the lowest first tier in the lower portion. Horizontally-elongated trenches are formed into the stack that are individually between immediately-laterally-adjacent of the memory-block regions and extend to the sacrificial material in the lowest first tier. The sacrificial material is isotropically etched from the lowest first tier through the trenches. The lowest second tier is removed after the isotropically etching. After removing the lowest second tier, conductive material is formed in the lowest first tier that directly electrically couples together the channel material of the individual channel-material strings and the conductor material of the conductor tier.

In some embodiments, a method used in forming a memory array comprising strings of memory cells comprises forming a conductor tier comprising conductor material on a substrate. A lower portion of a stack that will comprise vertically-alternating first tiers and second tiers is formed above the conductor tier. The stack comprises laterally-spaced memory-block regions. Material of the first tiers is of different composition from material of the second tiers. The lower portion comprises a lowest of the second tiers directly above the conductor material. The lowest second tier is sacrificial and comprises solid carbon and nitrogen-containing material. A lowest of the first tiers is directly above the lowest second tier. The lowest first tier comprises sacrificial material that is of different composition from that of the lowest second tier. A next-lowest of the second tiers is directly above the lowest first tier. The next-lowest second tier comprises the solid carbon and nitrogen-containing material. A conducting-material tier comprising conducting material is directly above the next-lowest second tier. The vertically-alternating first tiers and second tiers of an upper portion of the stack are formed above the lower portion. Channel-material strings are formed that extend through the first tiers and the second tiers in the upper portion to the lowest first tier in the lower portion. Horizontally-elongated trenches are formed into the stack that are individually between immediately-laterally-adjacent of the memory-block regions and extend to the sacrificial material in the lowest first tier. The sacrificial material is isotropically etched from the lowest first tier through the trenches. The lowest second tier and the next-lowest second tier are removed after the isotropically etching. After removing the lowest second tier and the next-lowest second tier, conductive material is formed in the lowest first tier directly against a bottom of the conducting material of the conducting tier and directly against a top of the conductor material of the conductor tier to directly electrically couple together the channel material of the individual channel-material strings with the conductor material of the conductor tier and the conducting material of the conducting tier.

In some embodiments, integrated circuitry comprising a memory array comprises strings of memory cells comprising laterally-spaced memory blocks that individually comprise a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises alternating first insulating tiers and second insulating tiers. The lower portion comprises a lowest insulator tier directly above conductor material of a conductor tier. The lowest insulator tier comprises solid carbon and nitrogen-containing material. An immediately-adjacent tier is directly above the solid carbon and nitrogen-containing material of the lowest insulator tier. The immediately-adjacent tier comprises material that is of different composition from that of the lowest insulator tier.

In some embodiments, integrated circuitry comprising a memory array comprises strings of memory cells comprising laterally-spaced memory blocks that individually comprise a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises alternating first insulating tiers and second insulating tiers. The lower portion comprises a lowest insulator tier directly above conductor material of a conductor tier. The lowest insulator tier comprises solid carbon and nitrogen-containing material. An immediately-adjacent tier is directly above the solid carbon and nitrogen-containing material of the lowest insulator tier. The immediately-adjacent tier comprises material that is of different composition from that of the lowest insulator tier. A next-lowest insulator tier is directly above the immediately-adjacent tier. The next-lowest insulator tier comprises the solid carbon and nitrogen-containing material. A conducting-material tier comprising conducting material is directly above the immediately-adjacent tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising a memory array comprising strings of memory cells, comprising:
   laterally-spaced memory blocks individually comprising a first vertical stack comprising alternating insulative tiers and conductive tiers, strings of memory cells comprising channel-material strings that extend through the insulative tiers and the conductive tiers, the conductive tiers individually comprising a horizontally-elongated conductive line; and
   a second vertical stack aside the first vertical stack, the second vertical stack comprising an upper portion and a lower portion, the upper portion comprising alternating first insulating tiers and second insulating tiers, the lower portion comprising:
      a lowest insulator tier directly above conductor material of a conductor tier, the lowest insulator tier comprising solid carbon and nitrogen-containing material; and
      an immediately-adjacent tier directly above the solid carbon and nitrogen-containing material of the lowest insulator tier, the immediately-adjacent tier comprising material that is of different composition from that of the lowest insulator tier.

2. The integrated circuitry of claim 1 wherein the solid carbon and nitrogen-containing material comprises carbon-doped silicon nitride.

3. The integrated circuitry of claim 2 wherein carbon content of the carbon-doped silicon nitride is 1 to 30 atomic percent.

4. The integrated circuitry of claim 3 wherein the carbon content of the carbon-doped silicon nitride is 5 to 25 atomic percent.

5. The integrated circuitry of claim 4 wherein the carbon content of the carbon-doped silicon nitride is 10 to 15 atomic percent.

6. The integrated circuitry of claim 1 wherein the solid carbon and nitrogen-containing material comprises $C_3N_4$.

7. The integrated circuitry of claim 1 comprising a next-lowest insulator tier directly above the immediately-adjacent tier, the next-lowest insulator tier comprising the solid carbon and nitrogen-containing material.

8. Integrated circuitry comprising a memory array comprising strings of memory cells, comprising:
  laterally-spaced memory blocks individually comprising a first vertical stack comprising alternating insulative tiers and conductive tiers, strings of memory cells comprising channel-material strings that extend through the insulative tiers and the conductive tiers, the conductive tiers individually comprising a horizontally-elongated conductive line; and
  a second vertical stack aside the first vertical stack, the second vertical stack comprising an upper portion and a lower portion, the upper portion comprising alternating first insulating tiers and second insulating tiers, the lower portion comprising:
    a lowest insulator tier directly above conductor material of a conductor tier, the lowest insulator tier comprising solid carbon and nitrogen-containing material;
    an immediately-adjacent tier directly above the solid carbon and nitrogen-containing material of the lowest insulator tier, the immediately-adjacent tier comprising material that is of different composition from that of the lowest insulator tier;
    a next-lowest insulator tier directly above the immediately-adjacent tier, the next-lowest insulator tier comprising the solid carbon and nitrogen-containing material; and
    a conducting-material tier comprising conducting material directly above the immediately-adjacent tier.

* * * * *